(12) United States Patent
Lee (10) Patent No.: US 7,279,763 B2
(45) Date of Patent: Oct. 9, 2007

(54) CMOS IMAGE SENSOR HAVING PHOTODIODE AND METHOD FOR MANUFACTURING THE SAME

(75) Inventor: Sang Gi Lee, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/320,484

(22) Filed: Dec. 29, 2005

(65) Prior Publication Data

US 2006/0145222 A1    Jul. 6, 2006

(30) Foreign Application Priority Data

Dec. 30, 2004    (KR) ............... 10-2004-0117183

(51) Int. Cl.
*H01L 31/0232*    (2006.01)

(52) U.S. Cl. ............... 257/435; 257/414; 257/428; 257/431; 438/48; 438/57; 438/69

(58) Field of Classification Search ............... None
See application file for complete search history.

(56) References Cited

U.S. PATENT DOCUMENTS 5,514,888 A * 5/1996 Sano et al. ............... 257/232
6,011,274 A * 1/2000 Gu et al. ............... 257/59

FOREIGN PATENT DOCUMENTS

KR          0165376       9/1998
KR    10-2004-0058664     7/2004

* cited by examiner

*Primary Examiner*—Evan Pert
*Assistant Examiner*—Kevin Quinto
(74) *Attorney, Agent, or Firm*—McKenna Long & Aldridge (57) ABSTRACT

A CMOS image sensor includes a photodiode in a semiconductor substrate; an insulating interlayer over the semiconductor substrate including the photodiode; a passivation layer pattern on the insulating interlayer corresponding to the photodiode; a first light-shielding layer pattern on the insulating interlayer between each passivation layer pattern; a second light-shielding layer pattern on the first light-shielding layer pattern; and at least one microlens on the passivation layer pattern.

12 Claims, 7 Drawing Sheets

CMOS IMAGE SENSOR HAVING PHOTODIODE AND METHOD FOR MANUFACTURING THE SAME

CROSS-REFERENCE TO RELATED APPLICATION

This application claims the benefit of Korean Patent Application No. 10-2004-0117183, filed on Dec. 30, 2004, which is hereby incorporated by reference for all purposes as if fully set forth herein.

BACKGROUND OF THE INVENTION

1. Field of the Invention

The present invention relates to a CMOS image sensor and a method for manufacturing the same, and more particularly, to a CMOS image sensor and a method for manufacturing the same, in which a microlens is formed between each light-shielding layer formed in the shape of an upside-down T, thereby improving the light-reflection properties of the microlenses and protecting the microlenses during or within packaging.

2. Discussion of the Related Art

Generally, an image sensor is a semiconductor device for converting an optical image to an electric signal. The image sensor can be broadly categorized into a charge coupled device (CCD) or a complementary metal oxide semiconductor (CMOS) image sensor.

In the CCD, respective metal-oxide-silicon MOS capacitors are positioned adjacently, wherein electric charge carriers are stored in and transferred to the capacitors. Meanwhile, the CMOS image sensor adopts the CMOS technology of using a control circuit and a signal processing circuit as the peripheral circuit. The CMOS image sensor uses the switching method of sequentially detecting output signals by forming the predetermined number of MOS transistors in correspondence with the number of pixels.

In accordance with conventional methods for manufacturing a vertical CMOS image sensor, a light-shielding layer may be used to prevent the reflection of light. However, it is inefficient in that it necessarily requires an additional process step. Also, the microlenses may be damaged during the packaging process.

Hereinafter, a CMOS image sensor and a method for manufacturing the same according to the related art will be described with reference to the accompanying drawings.

Figure 1:
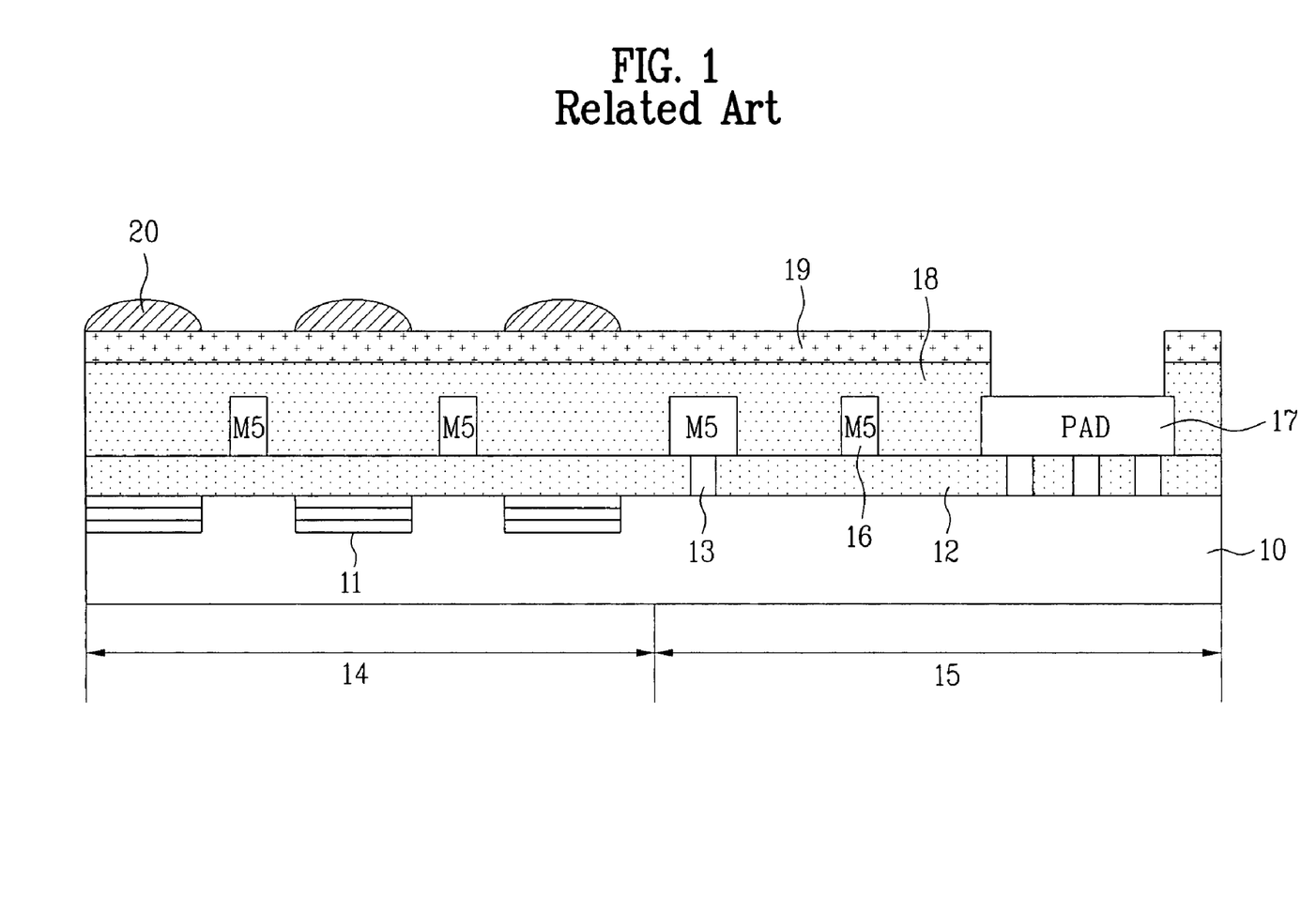
FIG. 1 is a cross sectional view of showing a CMOS image sensor according to the related art.

FIG. 1 is a cross sectional view of a CMOS image sensor according to the related art.

As shown in FIG. 1, a plurality of photodiodes 11 are formed in a semiconductor substrate 10. Then, a first insulating layer 12 is formed on the semiconductor substrate 10, including the plurality of photodiodes 11, and is then selectively etched to form a via-hole. After that, the via-hole is filled with a conductive material, thereby forming a contact 13. Subsequently, a metal layer is deposited and patterned on the first insulating layer 12, including the contact 13. Also, a metal line 16 is formed in a pixel region 14, and a metal line 16 and a pad 17 are formed in a peripheral region 15. Then, a second insulating layer 18 of oxide is formed and planarized on the first insulating layer 12, including the metal line 16 and the pad 17. Thereafter, a light-shielding layer (not shown) is formed on necessary portions of the second insulating layer 18.

To protect the light-shielding layer, a passivation layer 19 of oxide or nitride is formed and planarized by chemical mechanical polishing (CMP). Then, microlenses 20 are formed on the passivation layer 19, where each of the microlenses 20 is associated with a corresponding one of the photodiodes 11.

However, the CMOS image sensor and the method for manufacturing the same according to the related art have at least the following disadvantages.

When using the light-shielding layer, it is necessary to form the insulating layer for protecting the light-shielding layer, thereby causing inefficiency in the manufacturing process. Also, since the packaging process is performed on the microlenses, the microlenses may be damaged.

SUMMARY OF THE INVENTION

Accordingly, the present invention is directed to a CMOS image sensor and a method for manufacturing the same that substantially obviates one or more problems due to limitations and disadvantages of the related art.

The present invention provides a CMOS image sensor and a method for manufacturing the same, in which a microlens is formed between each light-shielding layer, where each light-shielding layer is formed in shape of a upside-down T, thereby improving the light-reflection properties of the microlenses and protecting the microlenses during packaging.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, a CMOS image sensor includes a photodiode in a semiconductor substrate; an insulating interlayer over the semiconductor substrate, including the photodiode; a passivation layer pattern on the insulating interlayer corresponding to the photodiode; a first light-shielding layer pattern on the insulating interlayer between each passivation layer pattern; a second light-shielding layer pattern on the first light-shielding layer pattern; and at least one microlens on the passivation layer pattern.

The second light-shielding layer pattern can be narrower than the first light-shielding layer pattern.

The microlens can be formed on the passivation layer pattern and predetermined portions of the first light-shielding layer pattern having no second light-shielding layer pattern.

The upper surface of the second light-shielding layer can be higher than the upper surface of the microlens.

In another aspect of the present invention, a method for manufacturing a CMOS image sensor includes forming an insulating interlayer over a semiconductor substrate, including a photodiode; forming a passivation layer pattern on the insulating interlayer corresponding to the photodiode; forming a first light-shielding layer pattern on the insulating interlayer between each passivation layer pattern; forming a second light-shielding layer pattern on the first light-shielding layer pattern; and forming at least one microlens on the passivation layer pattern.

The process of forming the first light-shielding layer pattern can include forming a first light-shielding material layer on the insulating interlayer, including the passivation layer pattern; and performing a planarization process to the first light-shielding material layer until the upper surface of the passivation layer pattern is exposed.

The process of forming the second light-shielding layer pattern can include forming a second light-shielding material layer on the passivation layer pattern and on the first light-shielding layer pattern; and selectively etching the second light-shielding material layer so as to expose the edge portions of the first light-shielding layer pattern and the passivation layer pattern.

Also, the process of forming the microlens includes forming a microlens material layer on the entire surface of the substrate, including the passivation layer pattern and the first and second light-shielding layer patterns; forming a microlens pattern by planarizing the microlens material layer until the upper surface of the second light-shielding layer pattern is exposed; and forming the microlens by performing a reflow process. In this case, the reflow process can be performed until the upper surface of the microlens is lower than the upper surface of the second light-shielding layer pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for manufacturing the same according to an exemplary embodiment the present invention will be described with reference to the accompanying drawings.

FIGS. 2A to 2F are cross sectional views of showing a CMOS image sensor manufactured according to an exemplary embodiment of the present invention.

Figure 2A:
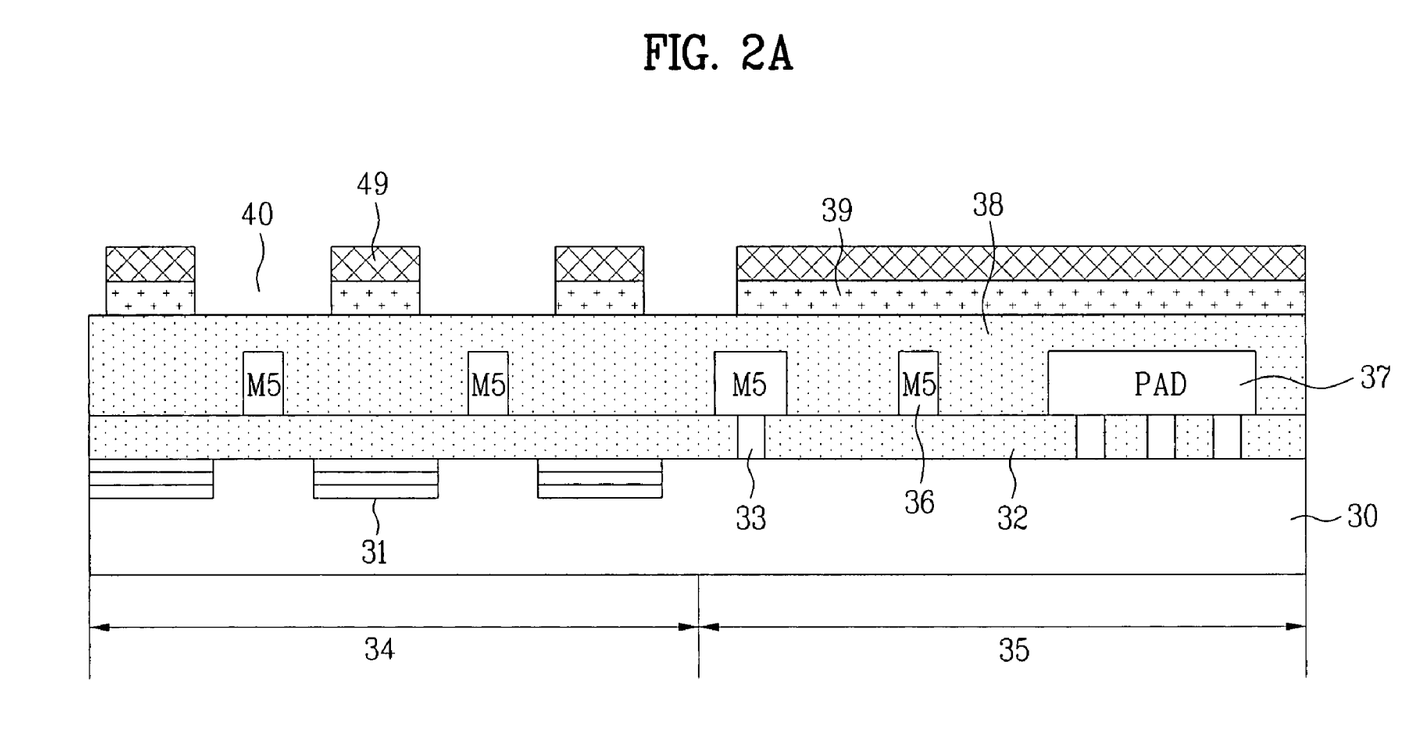
FIGS. 2A to 2F are cross sectional views of a CMOS image sensor manufactured according to an exemplary embodiment of the present invention.

As shown in FIG. 2A, a plurality of photodiodes 31 are in a semiconductor substrate 30. Then, a first insulating layer 32 is formed on the semiconductor substrate 30, including the plurality of photodiodes 31, and is then selectively etched to form a via-hole. The via-hole is filled with a conductive material, thereby forming a contact 33.

Subsequently, a metal layer is formed and patterned on the first insulating layer 32 including the contact 33. To connect the plurality of photodiodes 31 with a circuit, a metal line 36 is formed in a pixel region 34, and a metal line 36 and a pad 37 are formed in a peripheral region 35. Then, a second insulating layer 38 of an oxide layer is formed on the first insulating layer 32, including the metal line 36 and the pad 37. Also, a passivation layer 39 of a nitride layer is formed on the second insulating layer 38, and is then planarized by CMP. Then, a first photoresist pattern 49 having at least one opening for a microlens is formed on the passivation layer 39, and then the passivation layer 39 is etched using the first photoresist pattern 49 as a mask, thereby forming a first open area 40.

Figure 2B:
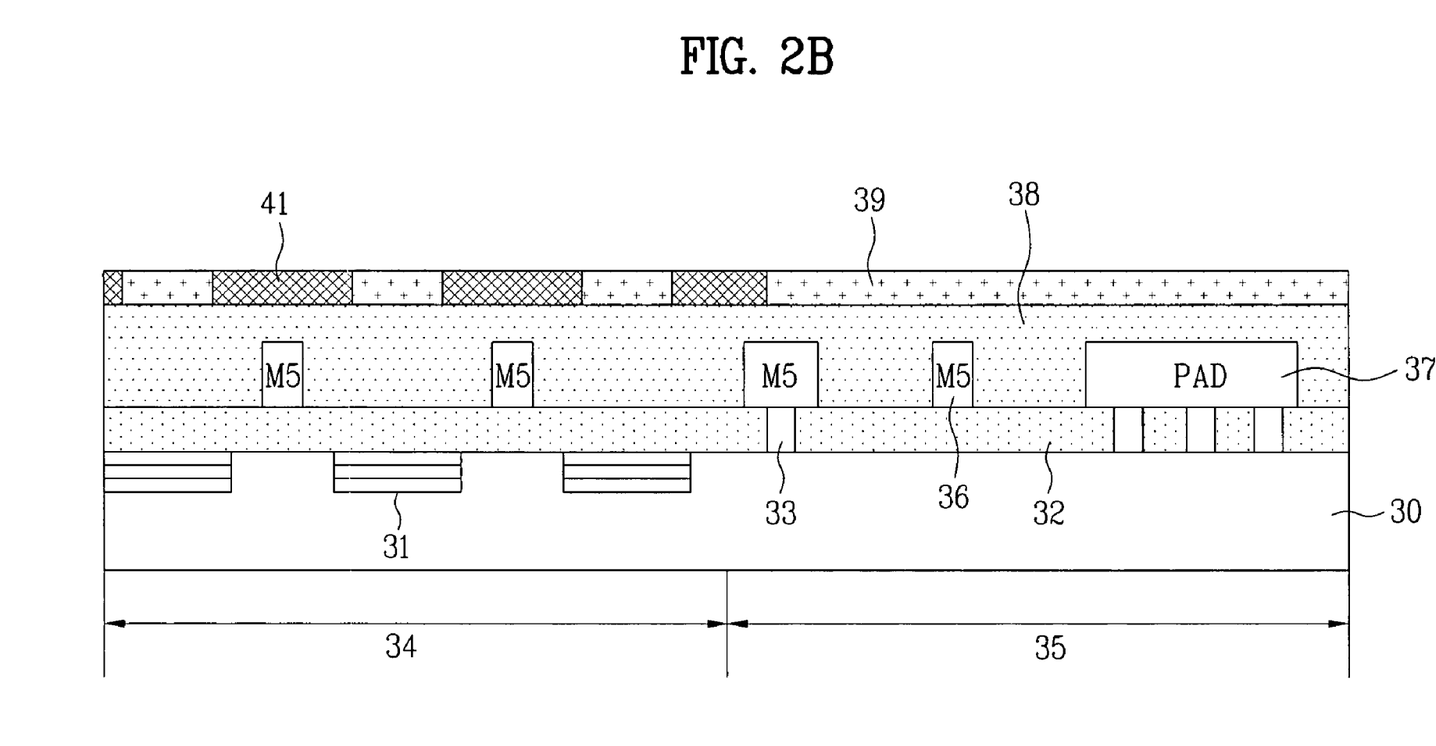

Referring to FIG. 2B, a first light-shielding material layer is deposited on the passivation layer 39, including the first open area 40, and then a planarization process is applied until the surface of the passivation layer 39 is exposed. The first open area 40 is filled with a first light-shielding material, thereby forming a first light-shielding layer 41. At this time, it is possible to control the size of the first light-shielding material layer with a process bias.

Figure 2C:
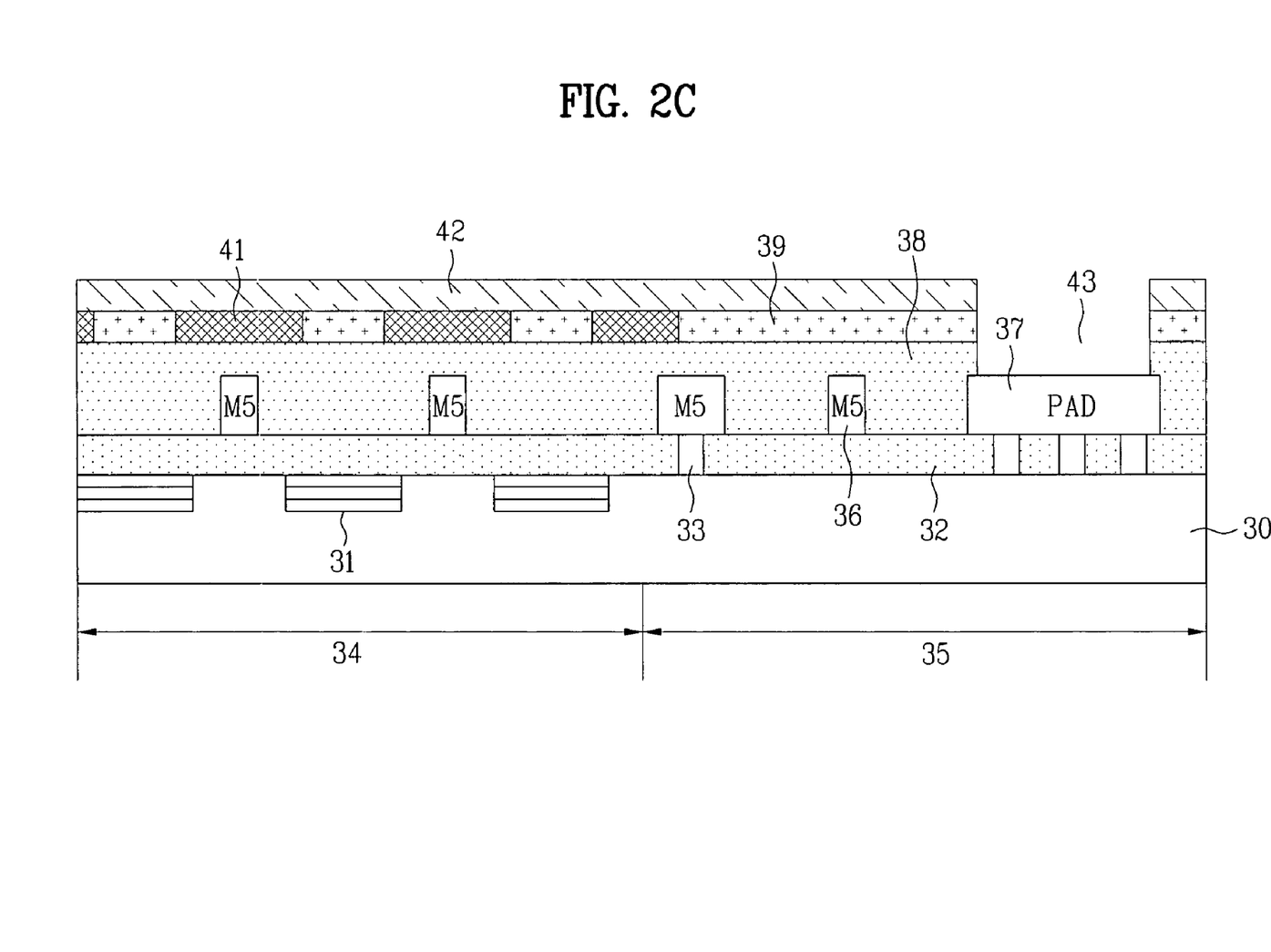

As shown in FIG. 2C, a second photoresist pattern 42 is formed by coating a photoresist and applying a pad mask (not shown). Then, the passivation layer 39 and the second insulating layer 38 corresponding to the pad 37 are etched using the second photoresist pattern 42 as a mask until the surface of the pad 37 is exposed, thereby forming a second open area 43.

Figure 2D:
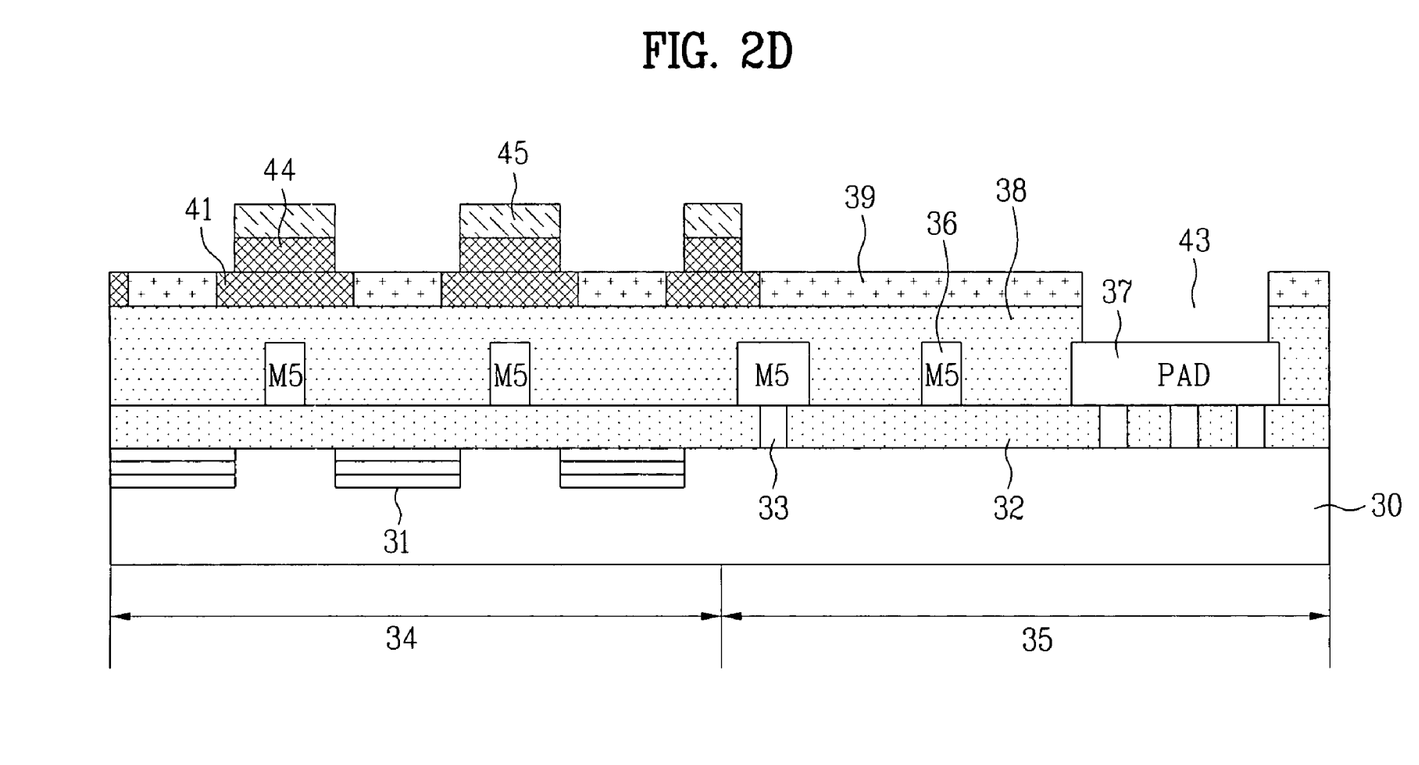

As shown in FIG. 2D, a second light-shielding material layer is deposited on the passivation layer 39 and the first light-shielding layer 41. Then, a third photoresist pattern 45 is formed on the second light-shielding material layer in correspondence with the center of the first light-shielding layer 41. The third photoresist pattern 45 is narrower than the first light-shielding layer 41. After that, the second light-shielding material layer is etched using the third photoresist pattern 45 as a mask, thereby forming a second light-shielding layer 44. Accordingly, a light-shielding layer, including the first and second light-shielding layers 41 and 44, is formed in shape of an upside-down T.

Figure 2E:
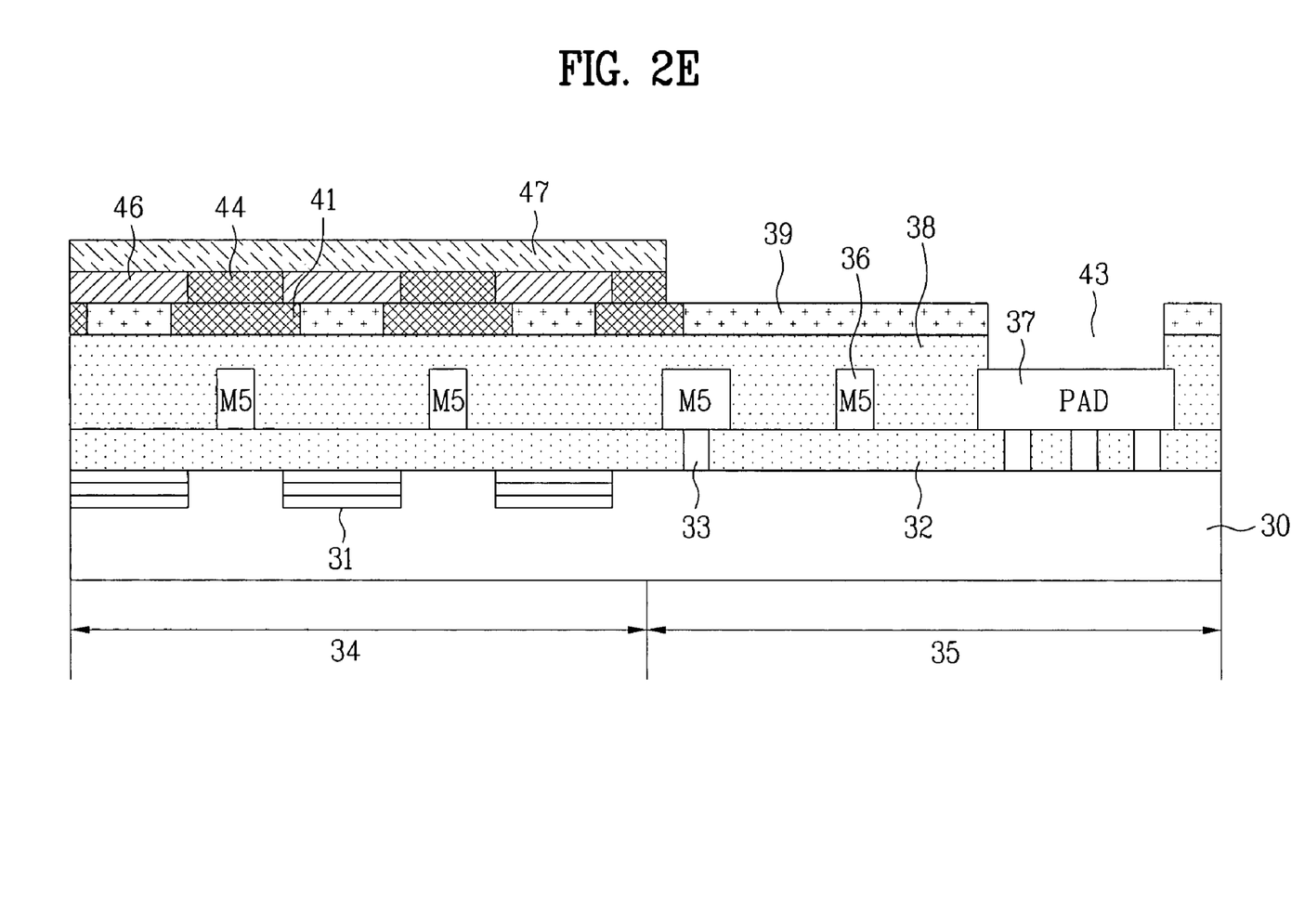

As shown in FIG. 2E, after removing the third photoresist pattern 45, a microlens material layer is deposited and planarized until exposing the surface of the second light-shielding layer 44. As a result, a microlens material pattern 46 is formed between each second light-shielding layer 44, and optionally, on the edges of one or more of the outermost second light shielding layers. Subsequently, a fourth photoresist pattern 47 is formed in the pixel region 34 to cover the microlens material pattern 46 and the second light-shielding layer 44. Then, the microlens material layer of the peripheral region 35 is removed using the fourth photoresist pattern 47 as a mask.

Figure 2F:
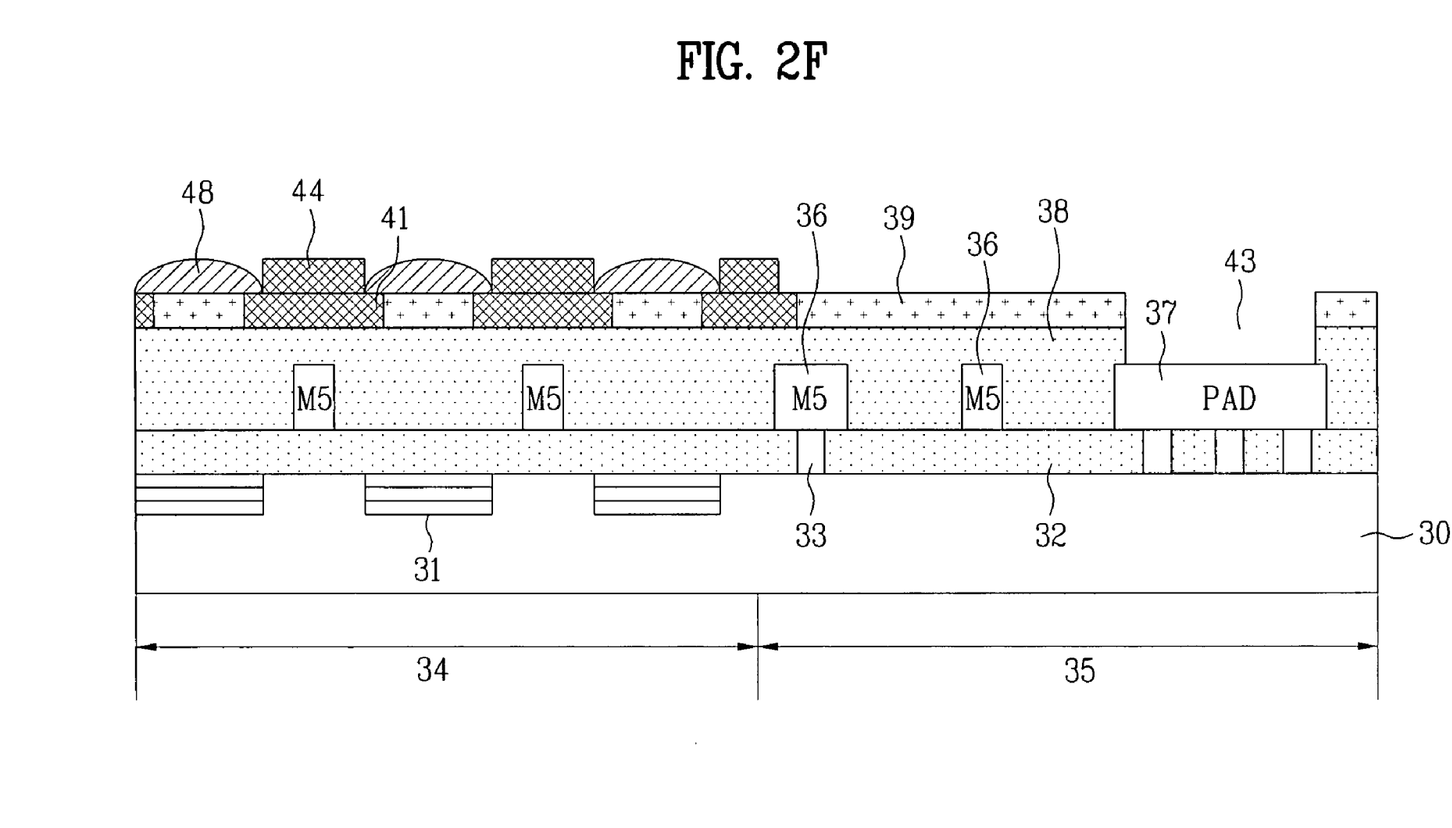

Referring to FIG. 2F, after removing the fourth photoresist pattern 47, a reflow process is performed to apply an appropriate heat to the microlens material pattern 46, whereby it is possible to form one or more microlenses 48 with a generally spherical shape. In the CMOS image sensor according to the exemplary embodiment of the present invention, the upper surface of the microlens 48 is lower than the upper surface of the second light-shielding layer 44 so as to protect the microlens 48.

Owing to the light-shielding layer, including the first and second light-shielding layers 41 and 44, shaped as an upside-down T, it is possible to improve the light-reflection properties of the microlens 48, and to improve the yield by protecting the microlens 48.

As mentioned above, the CMOS image sensor and the method for manufacturing the same according to the present invention have at least the following advantages.

In the CMOS image sensor according to an exemplary embodiment of the present invention, the microlens is positioned in a self-alignment adjacent or between each light-shielding layer to improve the light-reflection properties. The microlens can be positioned adjacent or between each light-shielding layer. In addition, it is possible to protect the microlens with the light-shielding layer in packaging, thereby improving the light-reflection properties and the yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
    a plurality of photodiodes in a semiconductor substrate;
    an insulating interlayer over the semiconductor substrate, including the photodiodes;
    a passivation layer pattern on the insulating interlayer corresponding to each of the photodiodes;
    a first light-shielding layer pattern on the insulating interlayer between each passivation layer pattern;
    a second light-shielding layer pattern on the first light-shielding layer pattern; and
    at least one microlens on the passivation layer pattern.

2. The CMOS image sensor of claim 1, wherein the second light-shielding layer pattern is narrower than the first light-shielding layer pattern.

3. The CMOS image sensor of claim 2, wherein the at least one microlens is formed on the passivation layer pattern and on a predetermined portion of the first light-shielding layer pattern having no second light-shielding layer pattern thereon.

4. The CMOS image sensor of claim 1, wherein the upper surface of the second light-shielding layer is higher than the upper surface of the at least one microlens.

5. The CMOS image sensor of claim 1, wherein the passivation layer pattern is formed with a nitride layer.

6. A method for manufacturing a CMOS image sensor comprising:
    forming an insulating interlayer over a semiconductor substrate, including a plurality of photodiodes;
    forming a passivation layer pattern on the insulating interlayer corresponding to each photodiodes;
    forming a first light-shielding layer pattern on the insulating interlayer between each passivation layer pattern;
    forming a second light-shielding layer pattern on the first light-shielding layer pattern; and
    forming at least one microlens on the passivation layer pattern.

7. The method of claim 6, wherein the second light-shielding layer pattern is narrower than the first light-shielding layer pattern.

8. The method of claim 6, wherein the process of forming the first light-shielding layer pattern includes:
    forming a first light-shielding material layer on the insulating interlayer, including the passivation layer pattern; and
    performing a planarization process to the first light-shielding material layer until an upper surface of the passivation layer pattern is exposed.

9. The method of claim 6, wherein the process of forming the second light-shielding layer pattern includes:
    forming a second light-shielding material layer on the passivation layer pattern and on the first light-shielding layer pattern; and
    selectively etching the second light-shielding material layer so as to expose edge portions of the first light-shielding layer pattern and the passivation layer pattern.

10. The method of claim 6, wherein the process of forming the at least one microlens includes:
    forming a microlens material layer on the entire surface of the substrate, including the passivation layer pattern and the first and second light-shielding layer patterns;
    forming a microlens pattern by planarizing the microlens material layer until exposing an upper surface of the second light-shielding layer pattern; and
    forming the at least one microlens by performing a reflow process.

11. The method of claim 10, wherein the reflow process is performed until an upper surface of the at least one microlens is lower than the upper surface of the second light-shielding layer pattern.

12. The method of claim 6, wherein the passivation layer pattern is formed with a nitride layer.

* * * * *